United States Patent [19]

DuBuske et al.

[11] 4,234,622
[45] Nov. 18, 1980

[54] VACUUM DEPOSITION METHOD

[75] Inventors: Stanley DuBuske, Lincroft; Willis M. Smith, Fair Haven; Edward Daly, Keyport, all of N.J.; Albert F. Newman, Sun City, Ariz.; Louis E. Branovich, Howell; Adolph G. Hager, Pt. Pleasant, both of N.J.

[73] Assignee: The United States of American as represented by the Secretary of the Army, Washington, D.C.

[21] Appl. No.: 28,935

[22] Filed: Apr. 11, 1979

[51] Int. Cl.$^3$ .............................................. B05D 3/06
[52] U.S. Cl. .............................. 427/45.1; 204/192 R; 204/192 C; 427/38; 427/251
[58] Field of Search ............... 427/38, 39, 42, 45, 427/250, 251, 252; 118/715, 719, 722, 730; 204/192 R, 192 C

[56] References Cited

U.S. PATENT DOCUMENTS

| | | | |
|---|---|---|---|
| 2,799,600 | 7/1957 | Scott | 427/38 |
| 3,110,620 | 11/1963 | Bertelsen | 118/719 |
| 3,485,666 | 12/1969 | Sterling et al. | 427/39 |
| 3,879,597 | 4/1975 | Bersin et al. | 204/129.3 |
| 3,991,229 | 11/1976 | Fengler | 427/42 |
| 4,056,642 | 11/1977 | Saxena et al. | 427/39 |
| 4,058,638 | 11/1977 | Morton | 427/39 |

FOREIGN PATENT DOCUMENTS 1104935 3/1968 United Kingdom .

*Primary Examiner*—John H. Newsome
*Attorney, Agent, or Firm*—Sheldon Kanars; Roy E. Gordon; Robert P. Gibson

[57] ABSTRACT

Metallic coatings are vacuum deposited onto a substrate using more than one deposition method in a single vacuum deposition chamber without breaking vacuum between depositions by providing a vacuum deposition chamber with an RF sputter electrode, a chemical vapor deposition assembly spaced from the sputter electrode, and a substrate that can be rotated from beneath the RF sputter electrode to beneath the chemical vapor deposition assembly, then cleaning and degassing the substrate under vacuum in the deposition chamber, then positioning the substrate below the RF sputter electrode, backfilling the chamber with argon, and then sputter depositing a metal coating onto the substrate and then rotating the coated substrate to beneath the chemical vapor deposition assembly, vacuum pumping the chamber, delivering the material to be chemically vapor deposited to the substrate surface, and heating the substrate to the temperature required for the chemical vapor deposition reaction to take place.

18 Claims, 1 Drawing Figure

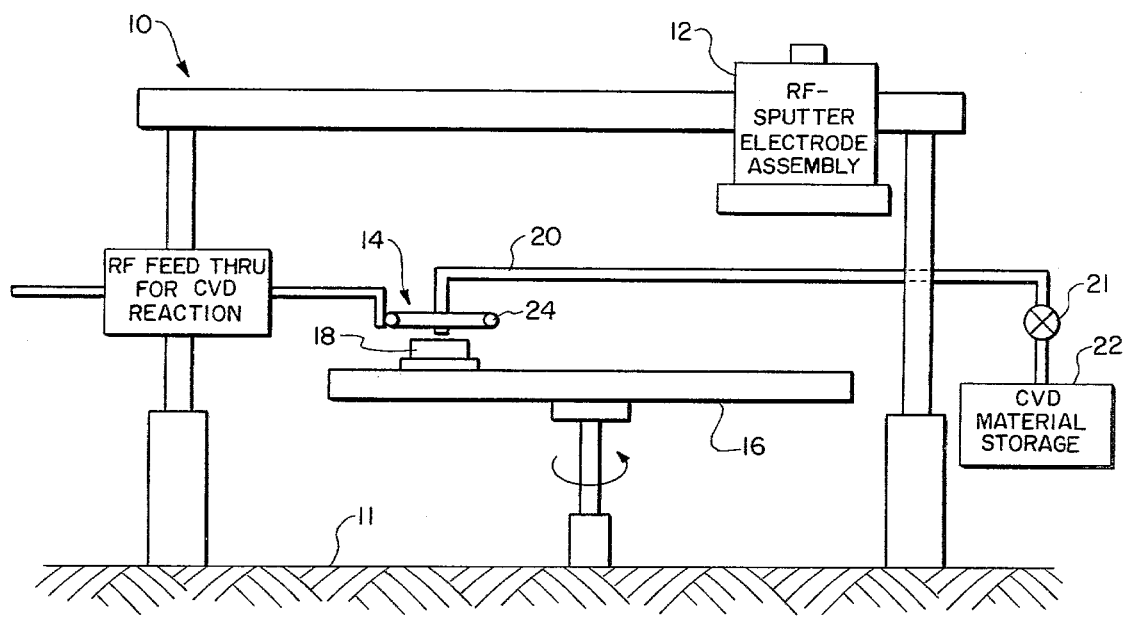

VACUUM DEPOSITION METHOD

The invention described herein may be manufactured, used, and licensed by or for the Government for governmental purposes without the payment to us of any royalty thereon.

This invention relates in general to a method of vacuum depositing more than one metallic coating onto a substrate and in particular to a method of vacuum depositing more than one metallic coating onto a substrate in a single vacuum deposition chamber without breaking vacuum between depositions.

BACKGROUND OF THE INVENTION

In the art of thin film coating, it has been known that one can use different types of depositions in the coating of a substrate as for example, a sputter deposit followed by a chemical vapor deposit. Such a procedure however, has required a break in the vacuum and the transfer of the substrate from a sputtering chamber to a chemical vapor deposition chamber. This transfer time has increased the cost of the deposition and introduced the possibility of atmospheric contamination.

SUMMARY OF THE INVENTION

The general object of this invention is to provide an improved method of depositing more than one film on a substrate using different deposition techniques. A more particular object of the invention is to provide such a method in which the depositions are carried out without breaking vacuum in the same vacuum deposition chamber. A particular object of the invention is to provide a method of vaccum depositing more than one film on a substrate by sputtering and chemical vapor deposition in the same chamber without a break in vacuum.

It has now been found that the aforementioned objects can be attained by a method including the steps of:
(a) providing a vacuum deposition chamber with an RF sputter electrode, a chemical vapor deposition assembly spaced from the sputter electrode, and a substrate that can be rotated from beneath the RF sputter electrode to beneath the chemical vapor deposition assembly,
(b) cleaning and degassing the substrate under vacuum in the deposition chamber,
(c) positioning the substrate below the RF sputter electrode, backfilling the chamber with argon, and then sputter depositing a coating onto the substrate, and
(d) rotating the coated substrate to beneath the chemical vapor deposition assembly, vacuum pumping the chamber, delivering the material to be chemically vapor deposited to the substrate, and heating the substrate to the temperature required for the chemical vapor deposition reaction to take place.

Additional coatings can be deposited by rotating the substrate from beneath the chemical vapor deposition assembly to beneath a second RF sputter electrode for a third deposition. For example, an initial RF sputter deposition of titanium can be followed by an RF sputter coating of copper.

The method can further be varied by changing the sequence of deposition; that is, by first using a chemical vapor deposition followed by multiple RF sputter coating on the substrate.

BRIEF DESCRIPTION OF THE DRAWING

The invention can best be illustrated by referring to the FIGURE which illustrates a physical arrangement of apparatus to carry out the invention.

Referring to the FIGURE, a vacuum deposition chamber 10 resting on surface 11 is provided with an RF sputter electrode 12 and a chemical vapor deposition assembly generally designated as 14 spaced from the RF sputter electrode. A rotatable substrate table 16 with a substrate 18 thereon is also positioned within vacuum deposition chamber 10 so that it can be rotated from beneath RF sputter electrode 12 to beneath the chemical vapor deposition assembly 14.

The chemical vapor deposition assembly, generally designated as 14 includes a delivery tube 20 for delivering material for chemical vapor deposition to the substrate 18, a source of material for the chemical vapor deposition 22, located externally to the vacuum deposition chamber 10 and connecting through valve 21 with an end of the delivery tube 20, and an RF coil 24 positioned around the other end of the delivery tube 20, to heat the substrate 18 to the chemical vapor deposition reaction temperature.

DESCRIPTION OF THE PREFERRED EMBODIMENT

The vacuum deposition chamber 10 is evacuated by a vacuum pump not shown to a value of $10^{-7}$ torr, then backfilled with argon to $10^{-2}$ torr, and the substrate 18 then glow discharge cleaned.

The initial deposition is the RF sputter deposition of a thin film of primer coating to enhance adherence of the films to the surface of the substrate 18. Suitable materials for RF sputter deposition include titanium and chromium. In the RF sputter deposition, the substrate table 16 is positioned so that the substrate 18 is directly below the RF sputter electrode 12. The vacuum deposition chamber 10 is then backfilled with argon and a sputter deposition made.

The substrate 18 is then rotated by means of the rotatable table 16 from beneath the sputter electrode 12 to beneath the RF coil 24 for the chemical vapor deposition reaction. The second coating is a chemical vapor deposition of a thicker film of a refractory metal such as molybdenum or tungsten. In the chemical vapor deposition, material is delivered to the substrate 18 by vacuum suction. The material in solid form as for example as a salt of the metal to be chemically vapor deposited is stored in the vacuum tight source 22 on the atmosphere side of vacuum deposition chamber 10. When needed, the control valve 21 is opened in the delivery tube 20 and the solid material drawn into the delivery tube 20 and deposited on the substrate 18. The RF coil 24 heats the substrate 18 to the temperature required for the chemical vapor deposition reaction to take place and the metal to be deposited.

The subsequent coatings can be additional RF sputter coatings or chemical vapor deposition coatings.

Any number of various types of depositions can be made if provision is made in the vacuum deposition chamber 10 for these depositions.

There is no exposure of the deposited surfaces to the atmosphere between coatings thus eliminating any contamination of the individual layers of the surface coatings.

Coatings of metals difficult to evaporate or sputter such as tungsten or molybdenum can be chemically vapor deposited on substrates.

In carrying out the method of the invention, the rotatable substrate table 16 is rotated within the vacuum deposition chamber 10 by means of an external magnet, not shown in the drawing.

As the substrate 18 one can use an insulator material generally in the form of a wafer. Suitable substrates include boron nitride, aluminum oxide, beryllium oxide, sapphire and quartz.

The thickness of the films RF sputter deposited and the thickness of the films chemically vapor deposited depend on the particular application to be made of the surface coating.

The chemical vapor deposition reactions are more rapid than the RF sputter depositions. For example, in one instance, it took only 17 minutes to prepare a 1 mil thick coating of tungsten on a boron nitride substrate.

We wish it to be understood that we do not desire to be limited to the exact details of construction as described for obvious modifications will occur to a person skilled in the art.

What is claimed is:

1. Method of vacuum depositing more than one metallic coating onto a substrate using different film deposition methods in a single vacuum deposition chamber without breaking vacuum between depositions, said method including the steps of:
   (a) providing a vacuum deposition chamber with an RF sputter electrode, a chemical vapor deposition assembly spaced from said sputter electrode, and a substrate that can be rotated from beneath the RF sputter electrode to beneath the chemical vapor deposition assembly, wherein said chemical vapor deposition assembly includes a delivery tube for delivering material for chemical vapor deposition to the substrate, a source of material for said chemical vapor deposition located externally to said vacuum deposition chamber and connecting with an end of said delivery tube, and an RF coil positioned around the other end of the delivery tube to heat the substrate to the chemical vapor deposition reaction temperature,
   (b) cleaning and degassing the substrate under vacuum in the deposition chamber,
   (c) positioning the substrate below the RF sputter electrode, backfilling the chamber with argon, and then sputter depositing a primary metal coating onto the substrate, and
   (d) rotating the coated substrate to beneath the chemical vapor deposition assembly, vacuum pumping the chamber to $10^{-7}$ torr, delivering the material to be chemically vapor deposited to the substrate surface, and heating the substrate to the temperature required for the chemical vapor deposition reaction to take place.

2. Method according to claim 1 wherein the substrate is a wafer of an insulator material selected from the group consisting of boron nitride, aluminum oxide, beryllium oxide, sapphire, and quartz.

3. Method according to claim 2 wherein the substrate is a wafer of boron nitride.

4. Method according to claim 2 wherein the substrate is a wafer of aluminum oxide.

5. Method according to claim 2 wherein the substrate is a wafer of beryllium oxide.

6. Method according to claim 2 wherein the substrate is a wafer of sapphire.

7. Method according to claim 2 wherein the substrate is a wafer of quartz.

8. Method according to claim 1 wherein the material for chemical vapor deposition is delivered in a controlled manner to the substrate surface by vacuum suction.

9. Method according to claim 1 wherein the primary metal sputter deposited onto the substrate is titanium.

10. Method according to claim 9 wherein the chemical vapor deposition reaction results in a material selected from the group consisting of molybdenum and tungsten being deposited on the primary deposition of titanium.

11. Method according to claim 10 wherein the chemical vapor deposition reaction results in molybdenum being deposited on the primary deposition of titanium.

12. Method according to claim 10 wherein the chemical vapor deposition reaction results in tungsten being deposited on the primary deposition of titanium.

13. Method according to claim 1 wherein the vacuum deposition chamber is provided with a second RF sputter electrode.

14. Method according to claim 13 wherein the substrate is rotated from beneath the chemical vapor deposition assembly to beneath the second RF sputter electrode, the vacuum chamber backfilled with argon to $10^{-2}$ torr, and a metal coating sputter deposited onto the chemically vapor deposited layer.

15. Method according to claim 1 wherein chromium is RF sputter deposited onto the substrate and molybdenum then chemically vapor deposited over the chromium.

16. Method according to claim 1 wherein chromium is RF sputter deposited onto the substrate and tungsten then chemically vapor deposited over the chromium.

17. Method according to claim 15 wherein copper is RF sputter deposited over the molybdenum.

18. Method according to claim 16 wherein copper is RF sputter deposited over the tungsten.

* * * * *